(12) United States Patent
Lee

(10) Patent No.: US 10,148,878 B2
(45) Date of Patent: *Dec. 4, 2018

(54) SYSTEMS AND METHODS FOR EXTENDING OPERATION OF RADIO-FREQUENCY POWER AMPLIFIERS

(71) Applicant: SKYWORKS SOLUTIONS, INC., Woburn, MA (US)

(72) Inventor: Innsung Lee, San Jose, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/729,665

(22) Filed: Oct. 10, 2017

(65) Prior Publication Data

US 2018/0035052 A1 Feb. 1, 2018

Related U.S. Application Data

(63) Continuation of application No. 15/345,128, filed on Nov. 7, 2016, now Pat. No. 9,787,897, which is a continuation of application No. 14/290,828, filed on May 29, 2014, now Pat. No. 9,490,641.

(51) Int. Cl.
| | |
|---|---|
| *H04N 5/232* | (2006.01) |
| *H02J 7/00* | (2006.01) |
| *H04N 5/225* | (2006.01) |
| *H03F 3/195* | (2006.01) |
| *H03F 3/213* | (2006.01) |

(52) U.S. Cl.
CPC ......... *H04N 5/23241* (2013.01); *H02J 7/007* (2013.01); *H02J 7/0045* (2013.01); *H02J 7/0047* (2013.01); *H02J 7/0065* (2013.01); *H02J 7/0068* (2013.01); *H04N 5/2256* (2013.01); *H04N 5/2257* (2013.01); *H02J 2007/005* (2013.01); *H03F 3/195* (2013.01); *H03F 3/213* (2013.01); *H03F 2200/451* (2013.01)

(58) Field of Classification Search
CPC ...... H02J 7/0068; H02J 7/0047; H05B 41/00; H05B 33/0803; H05B 33/0806; H05B 33/0842; H04N 5/2256; H04N 5/2354
See application file for complete search history.

(56) References Cited

U.S. PATENT DOCUMENTS

| | | | | |
|---|---|---|---|---|
| 7,851,941 | B2 * | 12/2010 | Walley | H02M 3/1582 307/18 |
| 8,093,874 | B1 * | 1/2012 | Huard | H02M 3/1582 323/259 |
| 9,490,641 | B2 * | 11/2016 | Lee | H02J 7/0047 |
| 9,787,897 | B2 * | 10/2017 | Lee | H04N 5/23241 |

(Continued)

*Primary Examiner* — Nicholas G Giles
(74) *Attorney, Agent, or Firm* — Chang & Hale LLP

(57) ABSTRACT

Systems and methods for extending operation of radio-frequency (RF) power amplifiers. In some embodiments, a method for fabricating a wireless device can be implemented. The method includes providing a flash LED driver and a radio-frequency block, coupling an output of the flash LED driver and the radio-frequency block and coupling the flash LED driver with a controller to allow the flash LED driver to provide boosted voltage to the radio-frequency block under a selected condition. Accordingly, the power amplifier can operate for a longer time when powered by a battery.

16 Claims, 9 Drawing Sheets

(56) References Cited

U.S. PATENT DOCUMENTS

2015/0349559 A1* 12/2015 Lee .................. H02J 7/0047
                                                           348/372
2017/0054908 A1* 2/2017 Lee .................. H02J 7/0047

\* cited by examiner

SYSTEMS AND METHODS FOR EXTENDING OPERATION OF RADIO-FREQUENCY POWER AMPLIFIERS

CROSS-REFERENCE TO RELATED APPLICATION(S)

This application is a continuation of U.S. Non-provisional application Ser. No. 15/345,128 filed Nov. 7, 2016 entitled SYSTEMS AND METHODS FOR EXTENDING OPERATION OF RADIO-FREQUENCY POWER AMPLIFIERS which claims priority to U.S. application Ser. No. 14/290,828 filed May 29, 2014 and entitled SYSTEMS AND METHODS FOR EXTENDING OPERATION OF RADIO-FREQUENCY POWER AMPLIFIERS, the disclosure of each of which is hereby expressly incorporated by reference herein in its entirety.

BACKGROUND

Field

The present disclosure relates to systems and methods for extending operation of radio-frequency amplifiers in wireless devices.

Description of the Related Art

Many wireless devices are powered by batteries. For example, a power amplifier (PA) is a component that utilizes power from a battery to amplify radio-frequency (RF) signals in a wireless device. As power is drawn from the battery for the operation of the PA as well as other functions of the wireless device, the battery's output voltage decreases gradually. When such a decrease results in the battery voltage to become less than some threshold value, operation of the PA can cease.

SUMMARY

In some implementations, the present disclosure relates to a system for operating a battery-powered wireless device. The system includes an LED (light-emitting diode) driver capable of generating a boosted-voltage output. The system further includes a controller coupled to the LED driver and configured to generate a control signal for the LED driver to generate the boosted-voltage output under a selected condition. The system further includes a switching circuit configured to route the boosted-voltage output of the LED driver to a radio-frequency (RF) block under the selected condition.

In some embodiments, the RF block can include a power amplifier. The LED driver can be configured to power a flash LED. The system can further include a camera module that includes the flash LED. The LED driver can be part of the camera module.

In some embodiments, the selected condition can include a battery voltage being less than a threshold value. The threshold value can be selected to be at or greater than a value below which the power amplifier ceases operation. The threshold value can be selected to be the value below which the power amplifier ceases operation plus a $\Delta V$ so that the boosted-voltage output of the LED driver is routed to the power amplifier before the power amplifier ceases operation. The boosted-voltage output can have a substantially constant value that is greater than the value below which the power amplifier ceases operation so that the routing of the boosted-voltage output to the power amplifier maintains operation of the power amplifier.

In some embodiments, the switching circuit can be configured to disconnect the LED driver from the power amplifier when in a condition other than the selected condition. The switching circuit can be configured to provide a substantially direct connection between an output of a battery and a power supply connection of the power amplifier. The LED driver and the power amplifier can be configured to be powered by a lithium-ion battery.

In accordance with a number of implementations, the present disclosure relates to a camera module for a wireless device. The module includes a substrate configured to receive a plurality of components. The module further includes a camera mounted on the substrate. The module further includes an LED mounted on the substrate and configured to provide illumination light during imaging operation of the camera. The module further includes a driver configured to provide power to the LED for the illumination light. The driver is further configured to generate a boosted-voltage output. The module further includes a switch circuit connected to the driver and configured to facilitate routing of the boosted-voltage output to a radio-frequency (RF) circuit located outside of the camera module.

In some embodiments, the driver and the switch circuit can be formed on a common die. The driver and the switch circuit can be formed on separate die.

In some embodiments, the RF circuit located outside of the camera module can include a power amplifier. The boosted-voltage output can have a substantially constant value.

In a number of implementations, the present disclosure relates to a wireless device that includes a transceiver configured to process RF signals, and an antenna in communication with the transceiver and configured to facilitate transmission of an amplified RF signal. The wireless device further includes a power amplifier connected to the transceiver and configured to generate the amplified RF signal. The wireless device further includes a camera module having a camera and a flash LED. The camera module further includes a driver configured to provide power to the flash LED. The driver is further configured to generate a boosted-voltage output. The camera module further includes a switch circuit connected to the driver and configured to facilitate routing of the boosted-voltage output to the power amplifier under a selected condition.

According to some implementations, the present disclosure relates to a method for operating a wireless device. The method includes monitoring an output value, Vbat, of a battery powering the wireless device. The method further includes controlling a flash LED driver to generate a boosted-voltage output if the output value Vbat is less than or equal to a threshold value. The method further includes routing the boosted-voltage output to a radio-frequency (RF) block when the boosted-voltage output is generated.

In some embodiments, the RF block can include a power amplifier. The method can further include operating the power amplifier with the boosted-voltage output of the flash LED driver.

In some implementations, the present disclosure relates to a method for fabricating a wireless device. The method includes providing a flash LED driver and a frequency (RF) block. The method further includes coupling an output of the flash LED driver and the RF block. The method further includes coupling the flash LED driver with a controller to allow the flash LED driver to provide boosted-voltage to the RF block under a selected condition.

In some embodiments, the RF block can include a power amplifier. The selected condition can include a battery output voltage falling below a value below which the power amplifier ceases operation, such that the providing of the boosted-voltage to the power amplifier increases an operating duration of the power amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
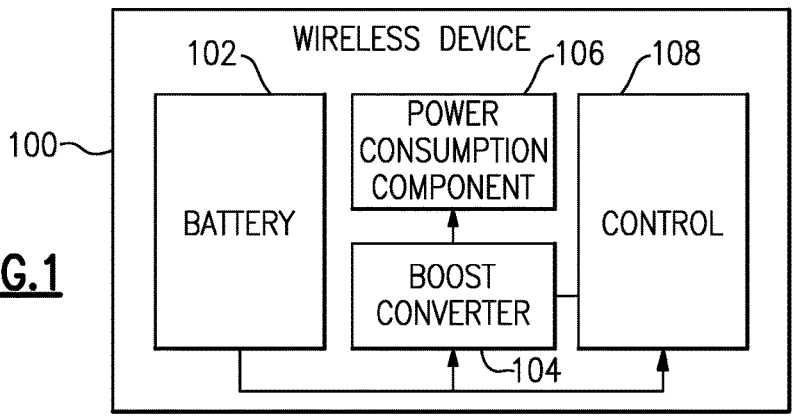
FIG. 1 depicts a wireless device having a battery and a power consumption component that utilizes power provided by the battery through a boost converter.

In some implementations, the present disclosure relates to systems and methods for extending the duration of battery operation in wireless devices. FIG. 1 schematically depicts a wireless device 100 having a battery 102 and a power consumption component 106 that utilizes power provided by the battery 102. For the purpose of description, the battery 102 can include a rechargeable battery such as lithium-ion battery. Although various examples in the present disclosure are described in the context of lithium-ion batteries, it will be understood that one or more features described herein can also be applied to other types of rechargeable batteries. Further, one or more features described herein can also be applied to non-rechargeable batteries to extend such batteries' operating duration.

Figure 2:
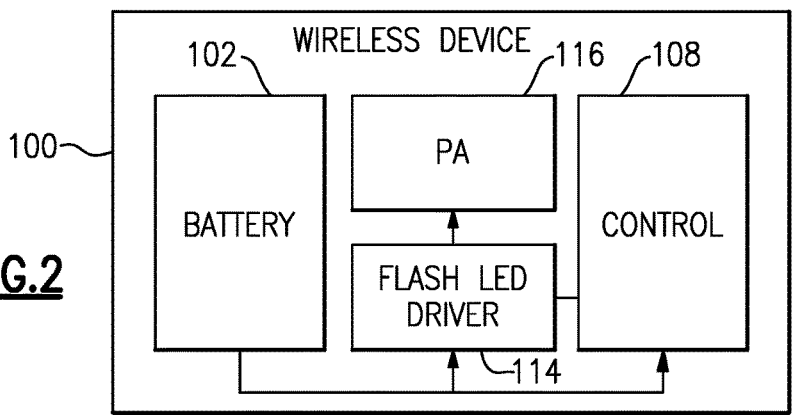
FIG. 2 shows that the power consumption component of FIG. 1 can be, for example, a power amplifier (PA).

As shown in FIGS. 1 and 2, the power consumption component 106 can include, for example, a power amplifier (PA) 116. Although various examples in the present disclosure are described in the context of PAs, it will be understood that one or more features described herein can also be applied to other components. For example, any component that draws power from the battery 102 and operates within a selected range of voltages of the battery 102 can benefit from the one or more features of the present disclosure.

FIG. 1 shows that the power consumption component 106 (such as the PA 116) can be provided with power from a boost converter 104 under some conditions. In some implementations, the boost converter 104 can be a component that does not provide power to the PA under normal operating conditions. For example, FIG. 2 shows that the boost converter 104 can be a flash LED driver 114 that is configured to provide power for operation of an LED flash device (not shown). Examples of how such a driver can be configured and/or controlled to provide power to the PA are described herein in greater detail.

In some implementations, controlling of the foregoing supplying of power from the example flash LED driver 114 to the PA can be facilitated by a control component 108. In some embodiments, the control component 108 can monitor or obtain information about the output voltage of the battery 102. Based on such an output voltage value, the control component 108 can issue one or more control signals to the flash LED driver 114 to effectuate providing of power to the PA 116.

Figure 3:
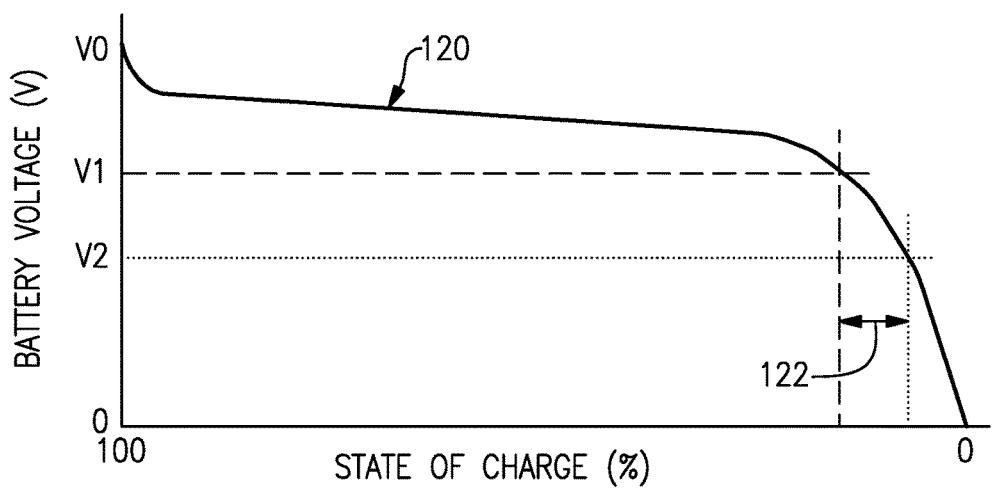
FIG. 3 shows an example of a battery discharge curve during operation of a wireless device.

FIG. 3 shows an example of a battery discharge curve 120 during operation of a wireless device. A freshly charged battery (e.g., Li-ion battery) having approximately 100% charge is shown to have an output voltage of V0. For some Li-ion batteries, V0 can be about 4.2V. As power is drawn from the battery, the output voltage decreases gradually.

In FIG. 3, V1 indicates a level of output voltage where the PA ceases operation due to its minimum voltage requirement. For example, some PAs have a minimum required supply voltage of about 3.2V to 3.4V. As described herein, the boost converter 104 (such as the flash LED driver 114) can be configured and/or controlled to provide power to the PA, so that the PA's power is above the minimum value V1. Such supplying of power from the flash LED driver 114 can continue until, for example, when the battery's output voltage falls to V2. As shown in FIG. 3, such lowering of the effective battery voltage for the operation of the PA can result in a longer operating duration (depicted by an arrow 122) of the PA, and therefore the wireless device. It is estimated that such extension of operating time can be up to about 20%.

Figure 4:
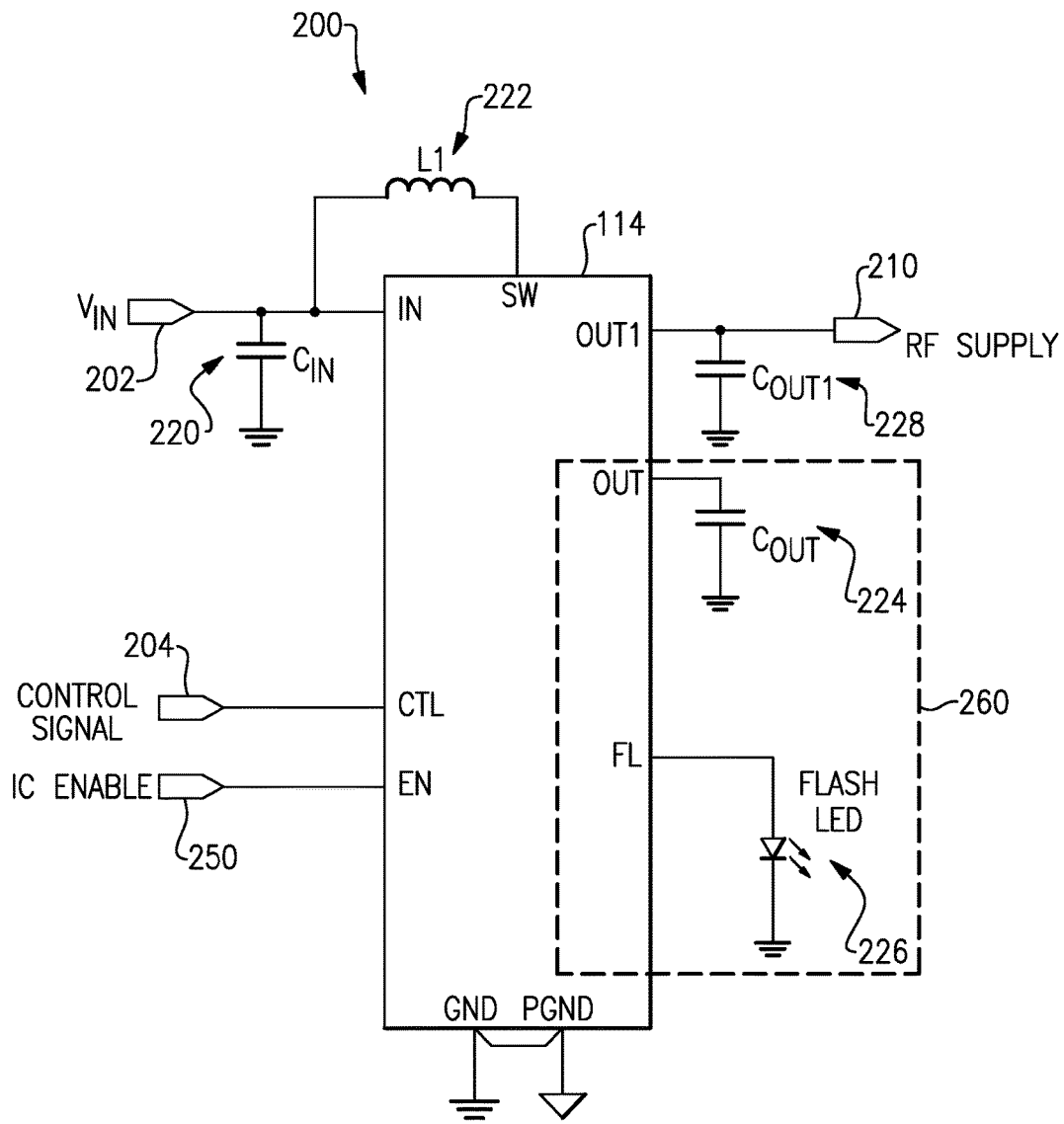
FIG. 4 shows an example configuration of a flash LED driver circuit that can be configured to provide power to a PA.
Figure 5:
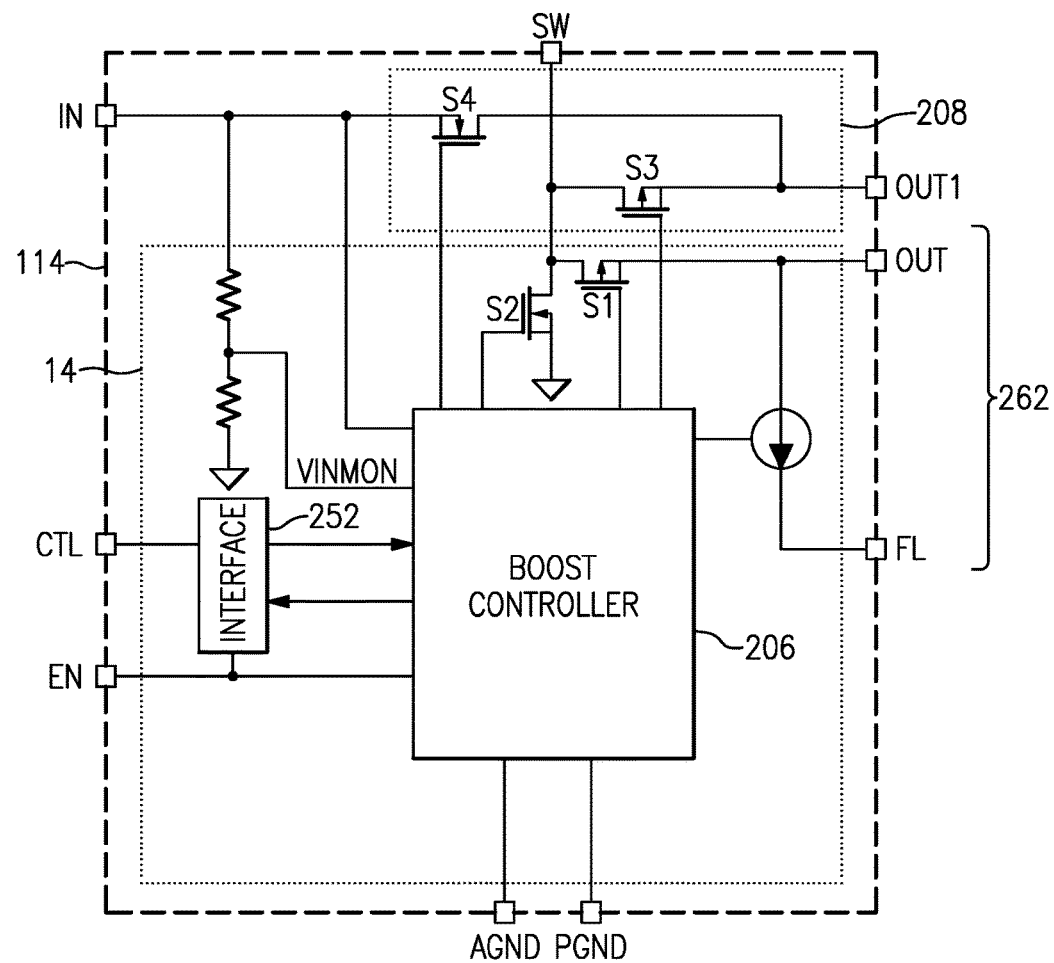
FIG. 5 shows a more detailed example of the flash LED driver circuit of FIG. 4.
Figure 6:
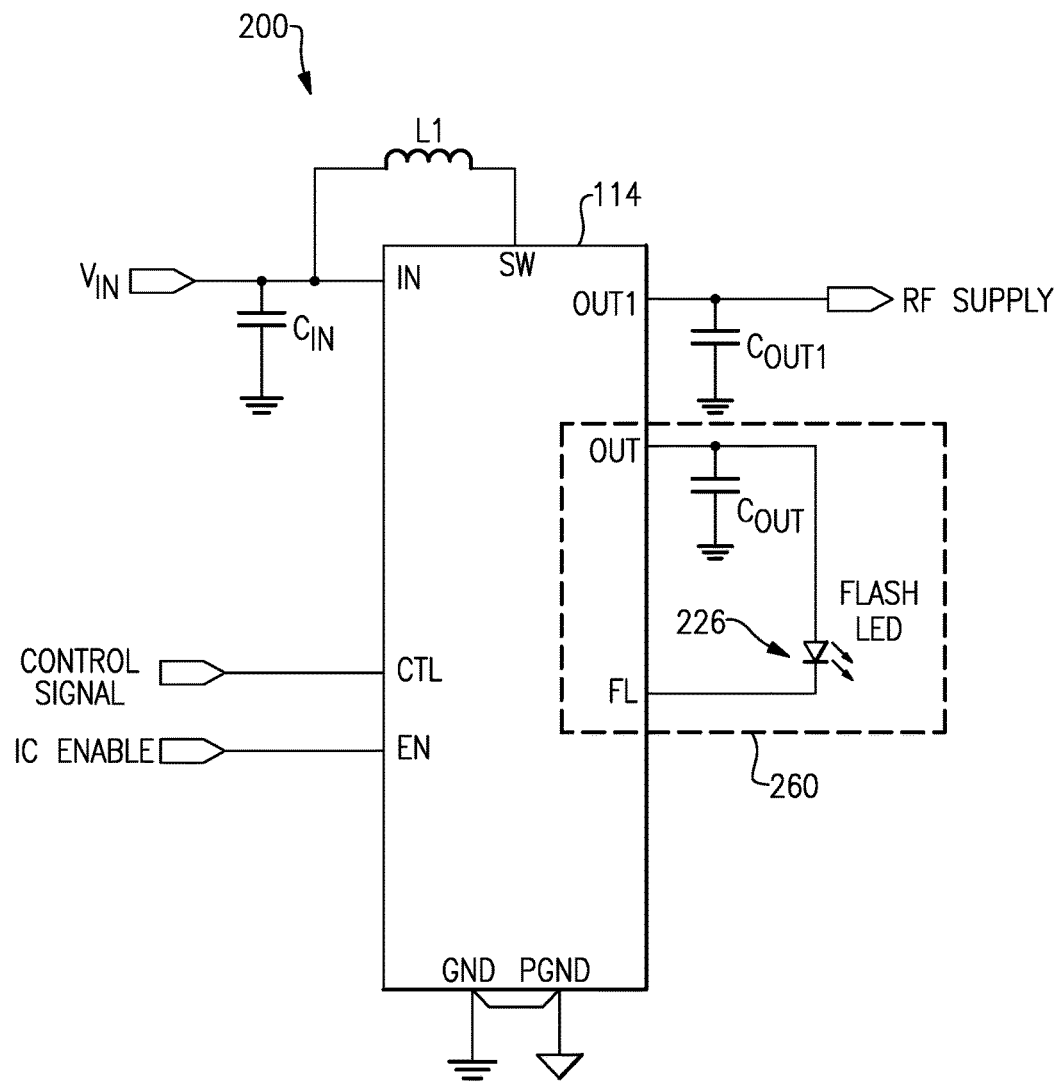
FIGS. 6 and 7 show examples of how an LED can be powered in a manner different than the examples of FIGS. 4 and 5.
Figure 7:
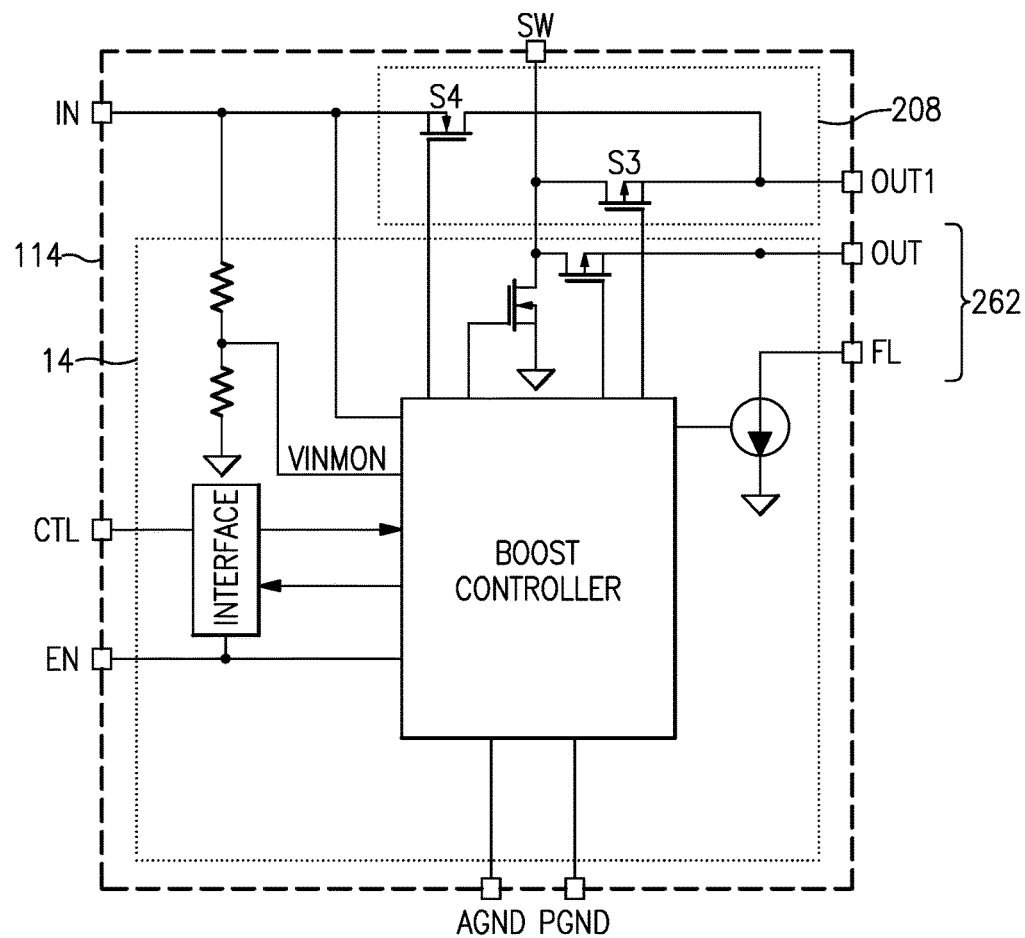

FIG. 4 shows an example configuration 200 of a flash LED driver circuit 114 that can be configured to provide power to a PA. FIG. 5 shows a more detailed example of the flash LED driver circuit 114 of FIG. 4. In some embodiments, the flash LED driver circuit 114 of FIG. 5 can be implemented on a die, and such a die can be connected with various components shown in FIG. 4 to form, for example, a module. Other implementations, including the examples described herein, are also possible. FIGS. 6 and 7 show examples of how an LED can be powered in a manner that is different from the examples of FIGS. 4 and 5.

FIGS. 4-7 show that some embodiments, the flash LED driver circuit 114 can be based on a conventional flash LED driver circuit 14. In some embodiments, added connections and components that facilitate the providing of power to the PA can be included on a die having the conventional flash LED driver circuit 14, outside of the die, or any combination thereof.

The flash LED driver circuit 114 is shown to include connection pins indicated as "SW," "IN," "CTL," "EN," "GND," "PGND," "FL," "OUT," and "OUT1." The "SW" pin can be utilized as a boost converter switching node, to allow the converter 14 to be activated de-activated (via switch S1, for example). The IN pin can be utilized as a power input for the converter 14. As shown, the IN pin is connected to a power source which in this example is a connection 202 to the battery (not shown). The IN pin is shown to be connected to a boost controller 206 configured to provide internal control of the flash LED driver circuit 114.

In some embodiments, a capacitor ($C_{IN}$) 220 (e.g., ceramic capacitor having capacitance of 2.2 μF or larger) can be provided between the IN pin and a power ground (PGND) for improved performance. In some embodiments, an inductor (L1) 222 (e.g., 1 μH) can be provided between the SW and IN pins.

The CTL and EN pins shown can be connected to control signal connection 204 and IC enable connection 250, respectively, and can be utilized for receiving control signals (including an enable signal) from an external controller (not shown). The CTL pin is shown to be connected to the boost controller 206 via an interface 252. The EN pin can be connected to the boost controller 206 directly. Examples of external control signals that can be provided to the boost controller 206 through the CTL pin are described herein in greater detail.

The GND pin can be utilized as an analog ground, and the PGND pin can be utilized as a power ground. In some embodiments, the two grounds can be connected for form a common ground.

Power can be provided from the flash LED driver circuit 114 to an LED flash 226 in different manners. For example, the LED flash 226 can be configured and connected to the driver circuit 114 to operate as a current source type (FIGS. 4 and 5), or as a current sink type (FIGS. 6 and 7). In the examples shown in FIGS. 4 and 5, flash-related outputs can be arranged in a flash-output configuration 262 as shown to facilitate a connection configuration 260 for the LED 226. In the examples shown in FIGS. 6 and 7, flash-related outputs can be arranged in a flash-output configuration 262 as shown to facilitate a connection configuration 260 for the LED 226.

In some embodiments, other control signals can be provided through the CTL pin. Such control signals can include "FLEN" (flash enable) and "FLINH" (flash inhibit). Examples of functionalities that can be effectuated by the flash LED driver circuit 114 and the foregoing control signals are described herein in greater detail.

In some embodiments, the conventional portion 14 of the flash LED driver circuit 114 can be configured as a boost converter with a current regulated output designed to drive high current white LED typically used in camera flash applications. The driver 14 can include a substantially constant current source or sink channel to accurately regulate the current flow through a high current, high intensity white flash LED. In some embodiments, the driver 14 can be configured to include two operating modes. The first mode can be a flash mode and the second mode can be a movie/torch light mode.

In the flash mode, a flash pulse can be initiated by receipt of the flash enable (FLEN) signal. A maximum flash current delivered to the LED can be limited by an external resistor; and such a resistor can set the flash current and a maximum current in the movie/torch mode.

In some embodiments, the flash inhibit (FLINH) signal can be provided to prevent both the camera flash and PA transmission pulses from occurring simultaneously. Such a functionality can avoid potential dips in the battery voltage below the system's undervoltage lockout threshold (UVLO). During a flash event, receipt of the FLINH signal can reduce the LED current to a default movie/torch mode current level for the duration of the FLINH signal.

In the movie/torch mode, the current level for the sustained operation of the LED can be adjusted to different values. A ratio between flash mode current level and movie/torch mode current level can also be adjusted. In situations where a manual FLEN signal is received during the movie/torch mode of operation, the flash operation based on the FLEN signal can have priority over the movie/torch mode.

In some embodiments, the EN control signal can provide functionalities such as enabling of one or more operating modes of the flash LED driver circuit 114. Such modes can include, for example, flash mode, movie/torch mode, and/or a mode for supplying power to a PA as described herein.

In some implementations, control signals provided to the flash LED driver 114 can include a signal that induces generation of a boosted voltage output for powering an RF component such as a PA. Upon receipt of such a signal, the flash LED driver 114 can be operated in manners described below by way of examples.

As describe herein, the driver 14 can be configured to operate in a number of different modes and under different conditions. In some implementations, the flash LED driver 114 can be configured so that at least some of the driver's functionalities can be utilized to provide power to the PA (through the OUT1 pin and the RF supply connection 210). As an example, a configuration shown in Table 1 (in reference to the example battery voltage levels of FIG. 3) can be implemented to provide power to the PA under certain conditions.

TABLE 1

| Battery voltage Vbat | Driver mode | Switch S1 | Switch S2 | Switch S3 | Switch S4 |
| --- | --- | --- | --- | --- | --- |
| Greater than V1' | Flash enabled, not operating | On | Off | Off | On |
| Greater than V1' | Flash enabled, operating | On | On/Off | Off | On |
| V2 < Vbat ≤ V1' | PA boost | Off | On/Off | On | Off |

In Table 1, the voltage value V1' can be defined as V1'=V1+ΔV, where V1 is the threshold value for PA operation, and ΔV can be a margin selected so that PA-boosting operation of the flash LED driver 114 can begin before the PA operation-ceasing threshold is reached. The voltage margin ΔV can be, for example, 0.1V, 0.2V, etc. Similar margin can be provided for the lower limit of the PA-boost operating range.

When the battery voltage Vbat is greater than V1', the driver 14 can be operated "normally" to supply power to the LED, but not to the PA. In such a mode, the flash can be enabled, but it may or may not be operating. For the purpose of description of Table 1, it will be understood that the flash mode can include the movie/torch mode. To effectuate the flash-enabled mode, switch S1 can be turned ON to allow routing of battery power to the LED, and switch S3 can be turned OFF to inhibit routing of power to one or more RF blocks (e.g., a PA) connection 210 via the OUT1 pin. In the flash-enabled mode where the battery voltage Vbat is greater than V1', switch S4 can be turned ON so that the OUT1 pin is directly connected to the battery without the boost. Switch S2 is a boost main switch that can be configured to switch between ON and OFF states to generate a required voltage when the driver 14 is powering the LED. When the driver is not powering the LED (but still in the flash-enabled mode), switch S2 can be turned OFF.

When the battery voltage Vbat is in a range V2<Vbat≤V1', the flash LED driver 114 can function as a boosted-voltage supply for one or more of the RF blocks (e.g., the PA). Such a mode is referred to herein as the PA boost mode, and can be facilitated by an appropriately configured control signal provided to the boost controller 206 through the CTL pin.

When in the PA boost mode, the flash LED driver 114 can undergo changes that include the following. The driver 114 can be configured to generate an output voltage at a boosted level (relative to the input battery voltage). The amount of boost can be selected to allow continued operation of the PA. In some embodiments, the boosted output voltage can be substantially constant, which is different from a typical movie/torch mode where the output has a substantially constant current.

In some embodiments, when the flash LED driver 114 is in the PA boost mode, all operations (e.g., flash and movie/torch modes) related to the LED can be disabled to allow continued servicing of the PA. To facilitate such a configuration, switch S1 can be turned OFF and switch S3 can be turned ON so that the boosted voltage output is routed to the PA (via the OUT1 pin) but not the LED.

When in the PA boost mode, switch S4 can be OFF so that the battery is no longer connected directly to the RF block(s). Instead, the output of the flash LED driver 114 can act as a power source for the RF block(s) (e.g., the PA). When in the PA boost mode, switch S2 can switch between ON and OFF states to generate a required voltage for powering the RF block(s) such as the PA.

Figure 8A:
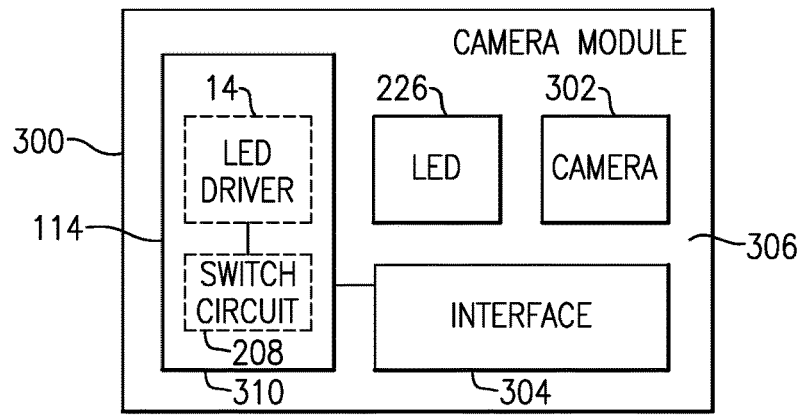
FIGS. 8A-8C show examples of how a switch circuit can be implemented with a flash LED driver circuit to yield one or more features as described herein.
Figure 8B:
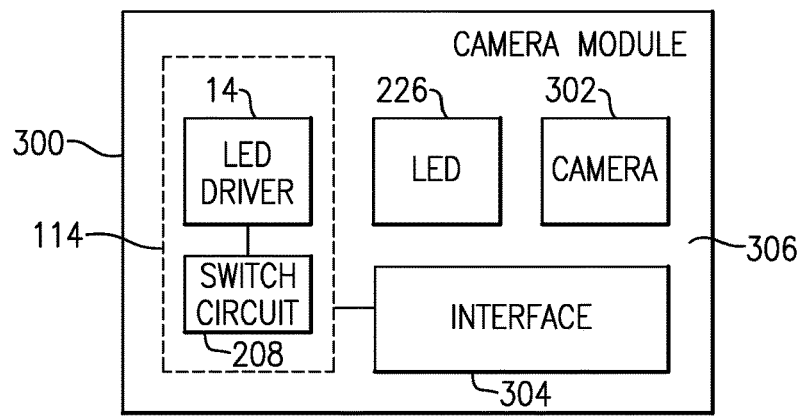
Figure 8C:
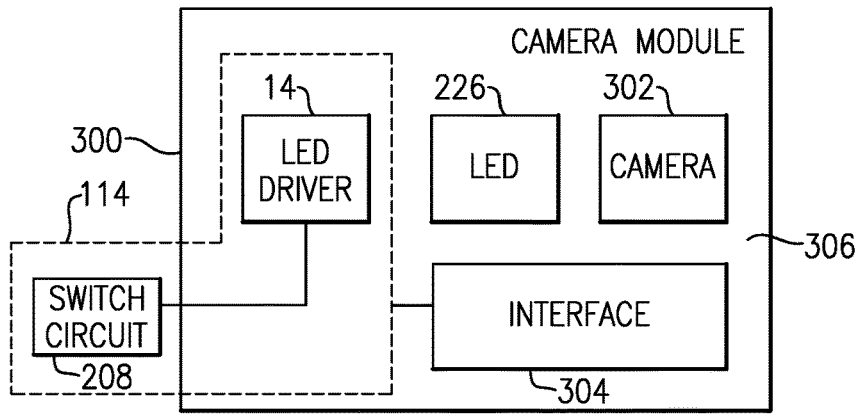

As shown in FIGS. 5 and 7, the foregoing switching functionalities that allow the flash LED driver 114 to switch between the flash and PA boost modes and route corresponding outputs can be facilitated by some or all parts of a switching circuit 208. In some embodiments, such a switch circuit can be implemented with the conventional flash LED driver circuit 14 in a number of ways. FIGS. 8A-8C show examples of such configurations.

FIG. 8A shows that in some embodiments, a flash LED driver 114 having one or more features as described herein can be implemented as an integrated circuit 310 (e.g., on a single die) that is part of a camera module 300. The die 310 can include a LED driver circuit portion 14 and a switch portion 208 as described herein. Such a die can be mounted on a packaging substrate 306 that is configured to receive a plurality of component, with the die 310 being one of such components. The flash LED driver 114 can be interconnected with an interface component 304 configured to facilitate passing of control signals and input and output of power signals to and from the flash LED driver 114 to achieve one or more desirable functionalities (e.g., passing of boosted voltage output to a PA) as described herein.

The camera module 300 is shown to further include an LED 226 that can be operated as described herein. The camera module 300 is shown to further include a camera unit 302 that can be operated in known manners. In some situations, the camera unit 302 can operate together with the LED 226.

FIG. 8B shows that in some embodiments, a flash LED driver 114 having one or more features as described herein can be implemented so that LED driver circuit portion 14 and switch portion 208 having features as described herein are formed as separate integrated circuits (e.g., on separate dies). Both of such dies can be mounted on a packaging substrate 306 that is configured to receive a plurality of component, with the dies being two of such components. The flash LED driver 114 can be interconnected with an interface component 304 configured to facilitate passing of control signals and input and output of power signals to and from the flash LED driver 114 to achieve one or more desirable functionalities (e.g., passing of boosted voltage output to a PA) as described herein.

FIG. 8C shows that in some embodiments, a flash LED driver 114 having one or more features as described herein can be implemented so that LED driver circuit portion 14 and switch portion 208 having features as described herein are formed as separate integrated circuits (e.g., on separate dies). In this example, the die having the LED driver circuit portion 14 is mounted on a packaging substrate 306 that is configured to receive a plurality of component, with the die 14 being one of such components. The other die having the switch portion 208 is shown to be located outside of the camera module, but in communication with the die 14. The flash LED driver 114 can be interconnected with an interface component 304 configured to facilitate passing of control signals and input and output of power signals to and from the flash LED driver 114 to achieve one or more desirable functionalities (e.g., passing of boosted voltage output to a PA) as described herein.

Figure 9:
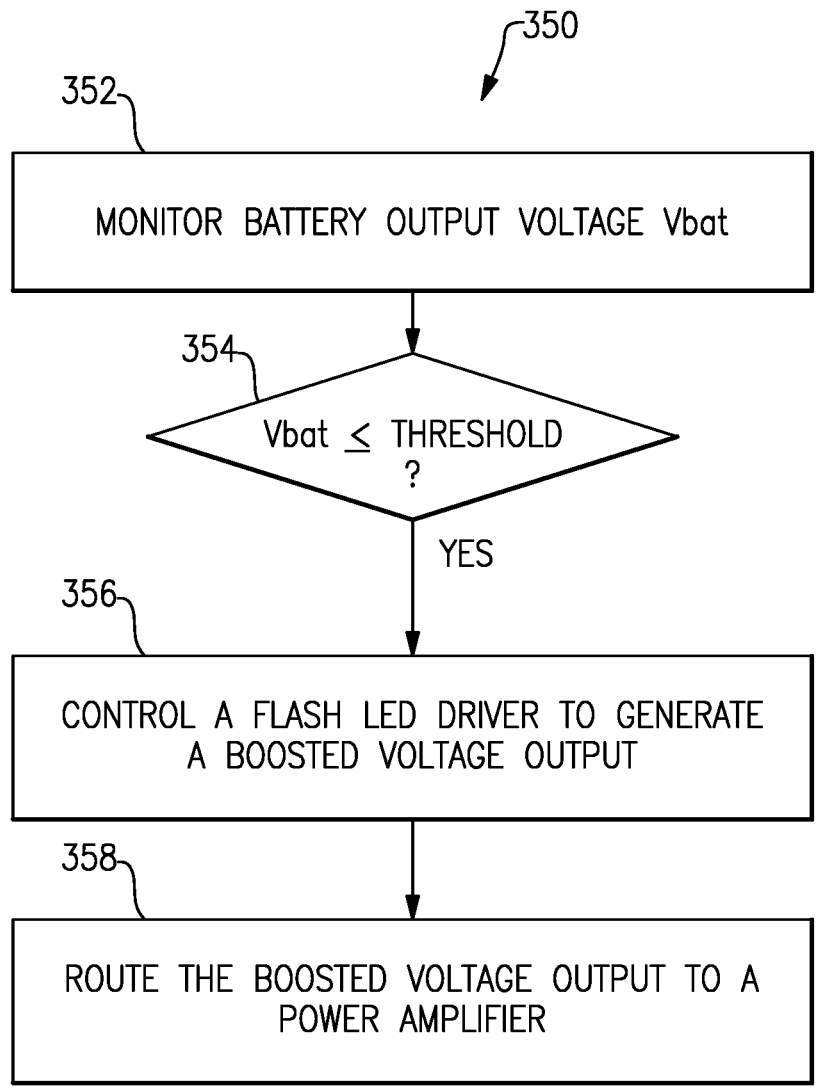
FIG. 9 shows a process that can be implemented to provide boosted voltage output of a flash LED driver to a PA to sustain its operation.

FIG. 9 shows a process 350 that can be implemented to provide boosted voltage output of a flash LED driver to a PA to sustain its operation. In block 352, battery output voltage (Vbat) can be monitored. In a decision block 354, the process 350 can determine whether Vbat is less than or equal to a threshold value. Such a threshold can be, for example, V1' described herein in reference to FIGS. 4-7. If the answer is "Yes," a flash LED driver can be controlled in block 356 to generate a boosted voltage output. In some implementations, the boosted voltage output can include a substantially constant voltage output having a value greater than Vt. In block 358, the boosted voltage output can be routed to a power amplifier. In some implementations, V1' can be selected to be same as or slightly higher than a voltage value below which the power amplifier ceases operation.

In some implementations, device(s) and/or circuit(s) having one or more features described herein can be included in an RF device such as a wireless device. In some embodiments, such a wireless device can include, for example, a cellular phone, a smart-phone, a hand-held wireless device with or without phone functionality, a wireless tablet, etc.

Figure 10:
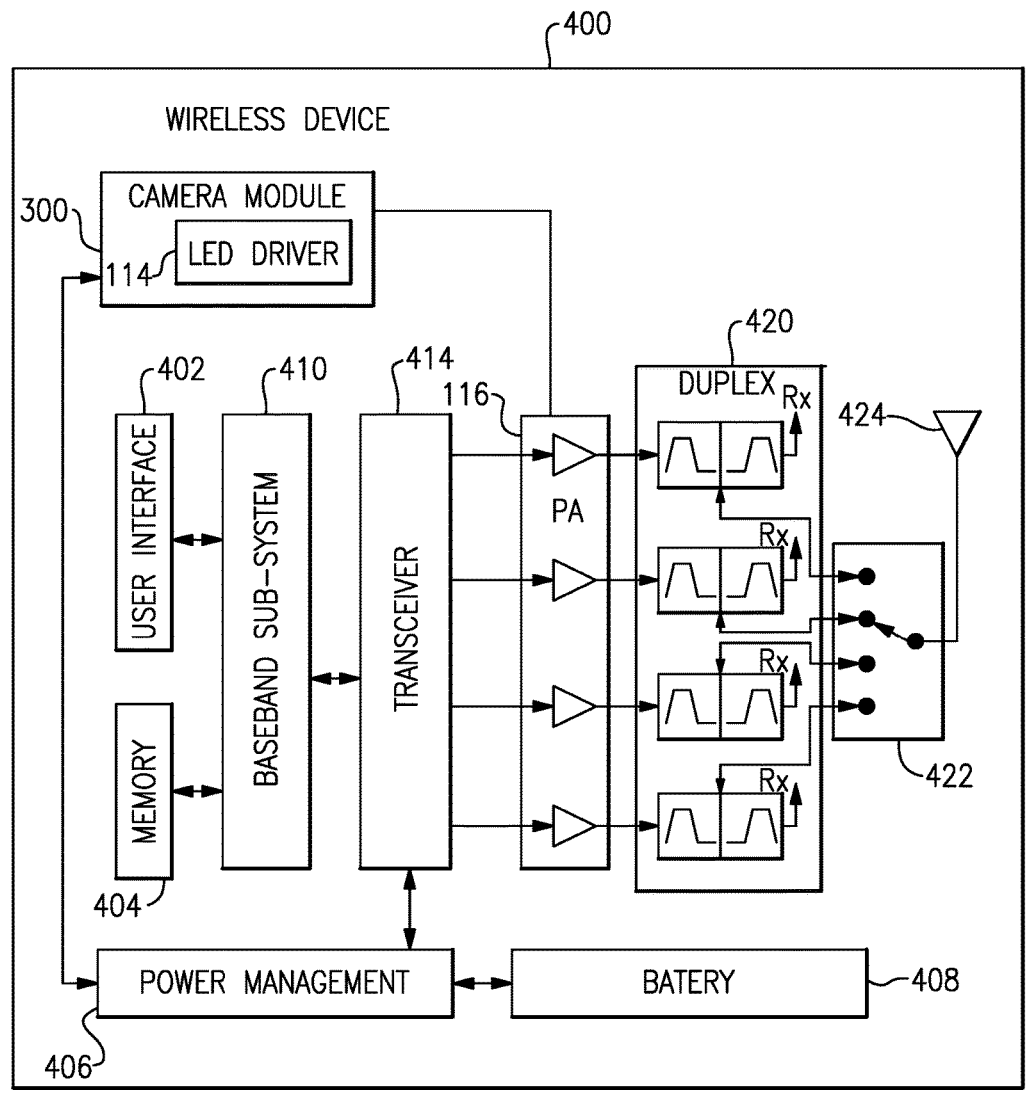
FIG. 10 depicts an example wireless device having one or more advantageous features described herein.

FIG. 10 schematically depicts an example wireless device 400 having one or more advantageous features described herein. In the context of PAs as described herein, a PA die having one or more PAs 116 can be part of a PA module. In some embodiments, such a PA module can facilitate, for example, multi-band operation of the wireless device 400.

The PAs 116 can receive their respective RF signals from a transceiver 414 that can be configured and operated in known manners to generate RF signals to be amplified and transmitted, and to process received signals. The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device. Such power management can also control operations of the baseband sub-system 410 and the PAs 116.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

In the example wireless device 400, outputs of the PAs 116 can be matched by a matching network and routed to an antenna 424 via their respective duplexers 420 and a band-selection switch 422. In some embodiments, each duplexer can allow transmit and receive operations to be performed simultaneously using a common antenna (e.g., 424). In FIG. 10, received signals are shown to be routed to "Rx" paths (not shown) that can include, for example, a low-noise amplifier (LNA).

The wireless device 400 is shown to further include a camera module 300 having a flash LED driver 114. Such a driver 114 can be configured as described herein to provide boosted voltage output to one or more PAs 116 under certain conditions. For example, when the output voltage of the battery 408 falls below a threshold where the PAs 116 cease to operate, the driver 114 can be controlled to generate the boosted voltage for the PAs 116. Operation of the driver 114 for providing such a functionality can be controlled by or facilitated by the power management or some other processor located within the wireless device 400.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Figure 11:
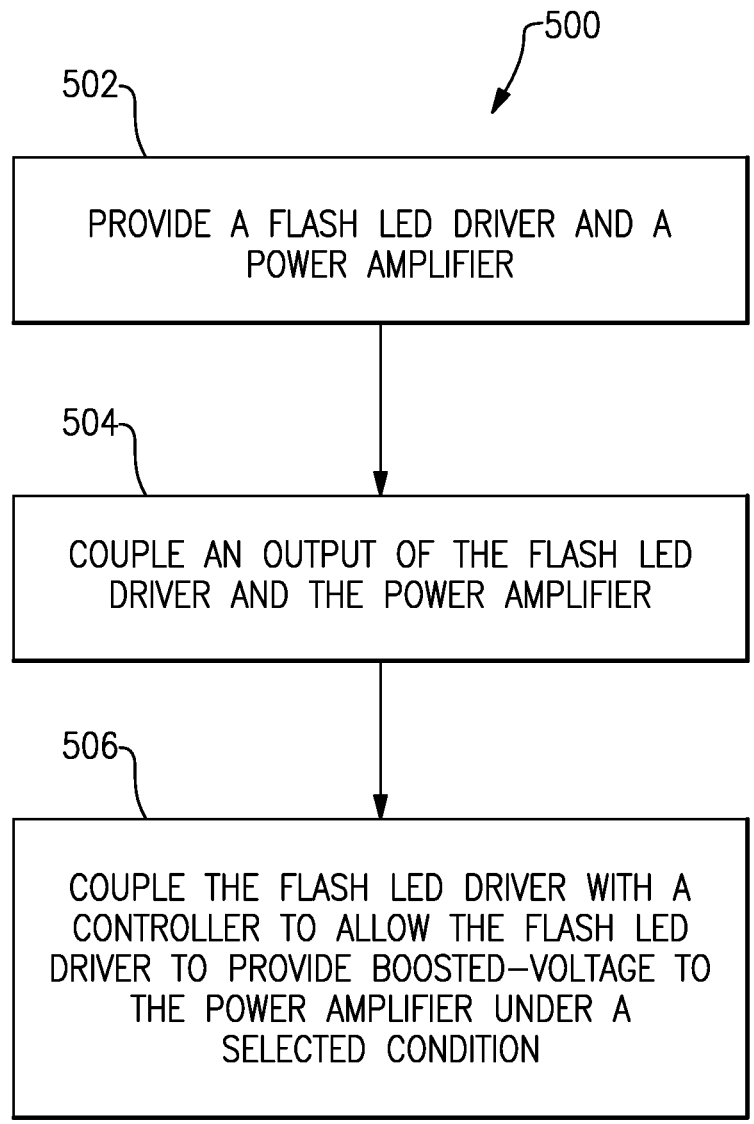
FIG. 11 shows a process that can be implemented to manufacture some or all of the wireless device of FIG. 10.

FIG. 11 shows a process 500 that can be implemented to manufacture some or all of the wireless device 400 of FIG. 10. In block 502, a flash LED driver and a PA can be provided. In block 504, an output of the flash LED driver and the PA can be coupled. In some embodiments, such coupling can include a switchable electrical connection configured to allow routing of boosted voltage output from the flash LED driver to the PA. In block 506, the flash LED driver and a controller can be coupled to allow the driver to provide the boosted voltage to the PA under certain conditions as described herein.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a wireless device, the method comprising:

providing a flash LED driver and a radio-frequency block;
coupling an output of the flash LED driver and the radio-frequency block; and
coupling the flash LED driver with a controller to allow the flash LED driver to provide boosted voltage to the radio-frequency block under a selected condition.

2. The method of claim 1 wherein the boosted voltage has a substantially constant value.

3. The method of claim 1 wherein the flash LED driver includes a boost converter.

4. The method of claim 1 further comprising providing a camera module that includes the flash LED driver.

5. The method of claim 1 further comprising providing a switching circuit configured to route the boosted voltage of the flash LED driver to the radio-frequency block under the selected condition.

6. The method of claim 5 wherein the selected condition includes a battery voltage being less than a threshold value.

7. The method of claim 6 wherein the radio-frequency block includes a power amplifier.

8. The method of claim 7 wherein the threshold value is selected to be at or greater than a value below which the power amplifier ceases operation.

9. The method of claim 8 wherein the threshold value is selected to be the value below which the power amplifier ceases operation plus a $\Delta V$ so that the boosted voltage of the LED driver is routed to the power amplifier before the power amplifier ceases operation.

10. The method of claim 8 wherein the boosted voltage routed to the radio-frequency block is routed to the power amplifier and has a substantially constant value that is greater than the value below which the power amplifier ceases operation so that the boosted voltage routed to the power amplifier maintains operation of the power amplifier.

11. The method of claim 8 wherein the switching circuit is further configured to disconnect the LED driver from the power amplifier when in a condition other than the selected condition.

12. The method of claim 8 wherein the switching circuit is further configured to provide a substantially direct connection between an output of a battery and a power supply connection of the power amplifier.

13. The method of claim 8 wherein the LED driver and the power amplifier are configured to be powered by a lithium-ion battery.

14. The method of claim 1 further comprising:
providing a substrate configured to receive a plurality of components;
mounting a camera on the substrate;
mounting an LED on the substrate configured to provide illumination light during imaging operation of the camera; and
mounting the flash LED driver and radio-frequency block on the substrate.

15. The method of claim 14 wherein the flash LED driver and the radio-frequency block are formed on a common die.

16. The method of claim 14 wherein the flash LED driver and the radio-frequency block are formed on separate die.

* * * * *